United States Patent
Liu

(10) Patent No.: US 8,951,832 B2
(45) Date of Patent: *Feb. 10, 2015

(54) VARIABLE-RESISTANCE MATERIAL MEMORIES AND METHODS

(71) Applicant: Micron Technology, Inc., Boise, ID (US)

(72) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/216,068

(22) Filed: Mar. 17, 2014

(65) Prior Publication Data

US 2014/0199821 A1 Jul. 17, 2014

Related U.S. Application Data

(63) Continuation of application No. 13/723,757, filed on Dec. 21, 2012, now Pat. No. 8,674,333, which is a continuation of application No. 12/014,867, filed on Jan. 16, 2008, now Pat. No. 8,338,812.

(51) Int. Cl.
*H01L 21/06* (2006.01)
*H01L 21/82* (2006.01)
*H01L 45/00* (2006.01)
*H01L 27/10* (2006.01)
*H01L 27/24* (2006.01)

(52) U.S. Cl.
CPC .......... *H01L 45/1608* (2013.01); *H01L 27/101* (2013.01); *H01L 27/24* (2013.01); *H01L 45/1253* (2013.01)

USPC .......... 438/102; 438/128; 438/258; 438/382; 438/397; 438/570

(58) Field of Classification Search
USPC ............................... 257/2, E21.602, E47.001
See application file for complete search history.

(56) References Cited

U.S. PATENT DOCUMENTS

| | | | |
|---|---|---|---|
| 7,122,824 B2 | 10/2006 | Khouri et al. | |
| 7,220,983 B2 | 5/2007 | Lung | |
| 7,335,907 B2 | 2/2008 | Terao et al. | |
| 8,338,812 B2 | 12/2012 | Liu | |
| 8,674,333 B2 | 3/2014 | Liu | |
| 2006/0046509 A1 | 3/2006 | Gwan-Hyeob | |

(Continued)

FOREIGN PATENT DOCUMENTS

WO WO-2007102341 A1 9/2007

OTHER PUBLICATIONS

Ha, Y. H., et al., "An Edge Contact Type Cell for Phase Change RAM Featuring Very Low Power Consumption", Symposium on VLSI Technology Digest of Technical Papers, (2003), 175-176.

(Continued)

*Primary Examiner* — Mamadou Diallo
(74) *Attorney, Agent, or Firm* — Schwegman Lundberg & Woessner, P.A.

(57) ABSTRACT

Variable-resistance memory material cells are contacted by vertical bottom spacer electrodes. Variable-resistance material memory spacer cells are contacted along the edge by electrodes. Processes include the formation of the bottom spacer electrodes as well as the variable-resistance material memory spacer cells. Devices include the variable-resistance memory cells.

17 Claims, 13 Drawing Sheets

(56) References Cited

U.S. PATENT DOCUMENTS

| | | |
|---|---|---|
| 2006/0091479 A1 | 5/2006 | Cho et al. |
| 2006/0110878 A1 | 5/2006 | Lung et al. |
| 2006/0124916 A1 | 6/2006 | Lung |
| 2006/0205145 A1 | 9/2006 | Moore et al. |
| 2009/0179184 A1 | 7/2009 | Liu |
| 2010/0225438 A1 | 9/2010 | Wei et al. |
| 2013/0134378 A1 | 5/2013 | Liu |

OTHER PUBLICATIONS

Hudgens, S., et al., "Overview of Phase-Change Chalcogenide Nonvolatile Memory Technology", MRS Bulletin, (Nov. 2004), 829-832.

Pellizzer, F., et al., "Novel U-Trench Phase-Change Memory Cell for Embedded and Stand-Alone Non-Volatile Memory Applications", Symposium on VLSI Tecnology Digest of Technical Papers, (2004), 18-19.

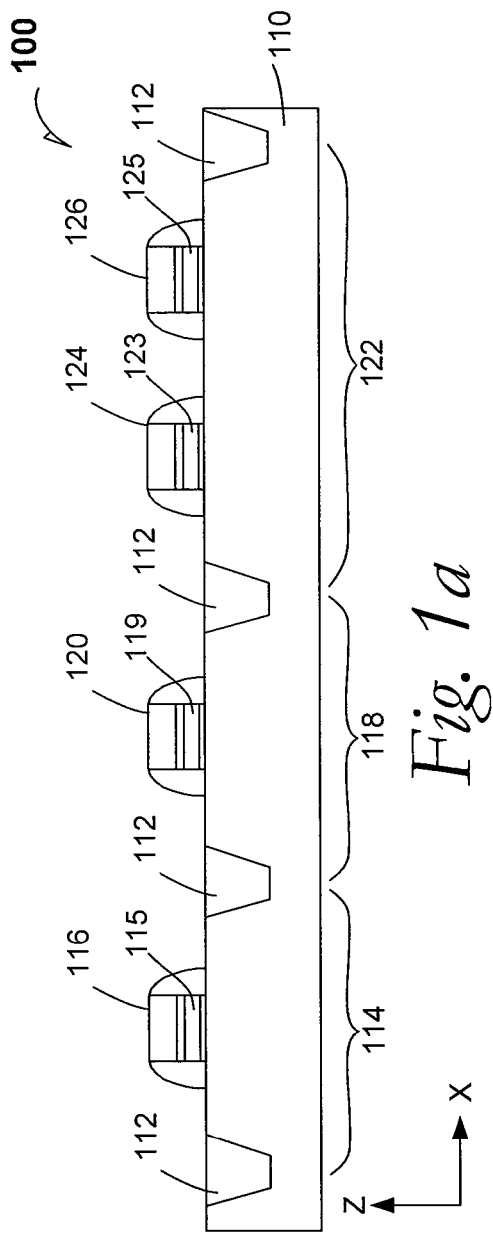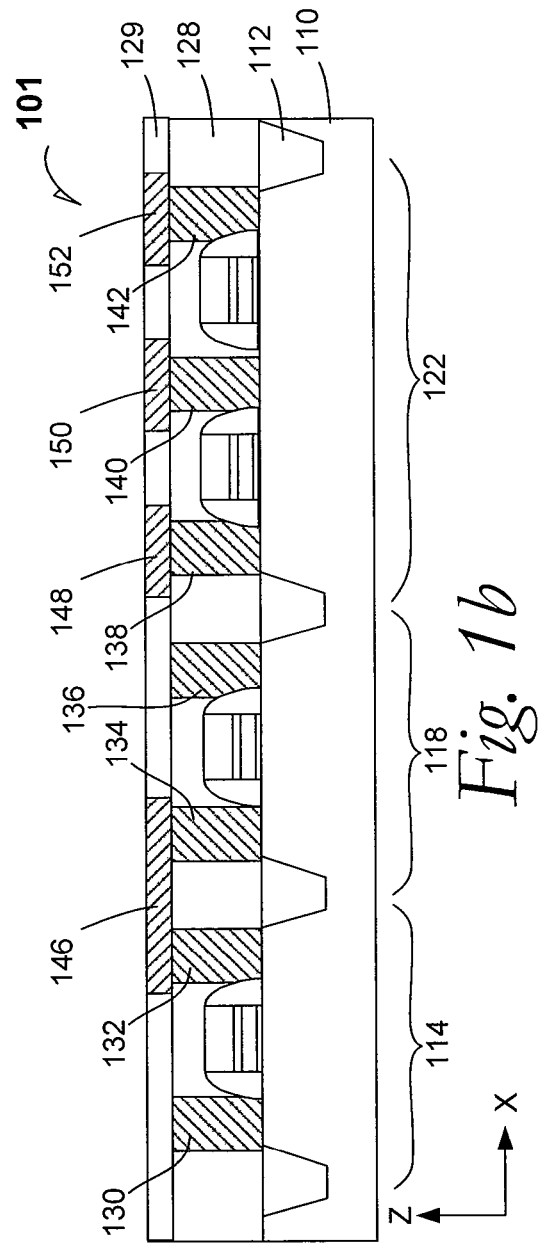

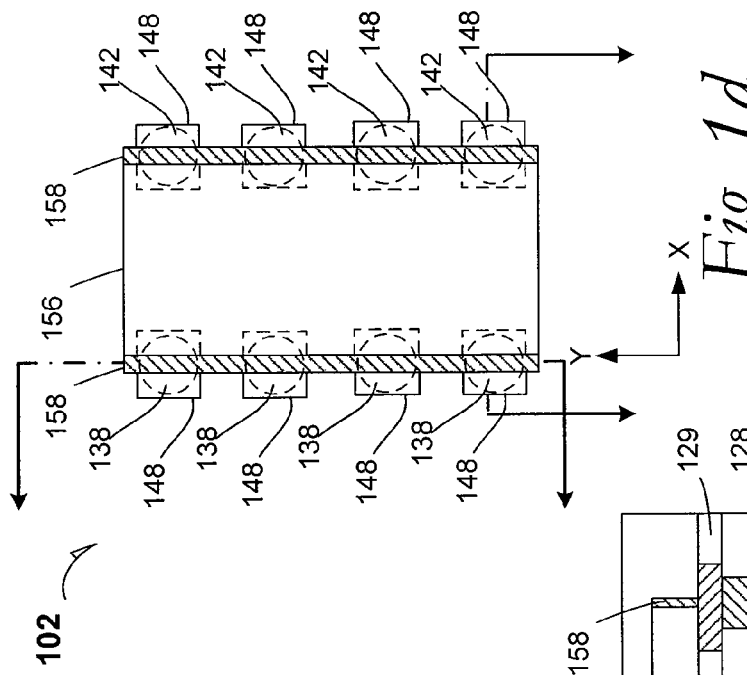
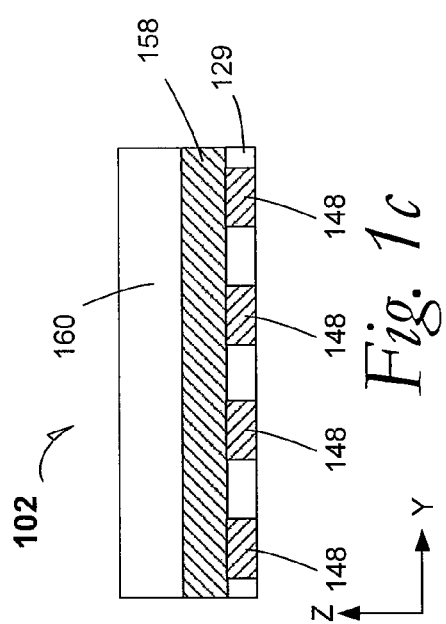
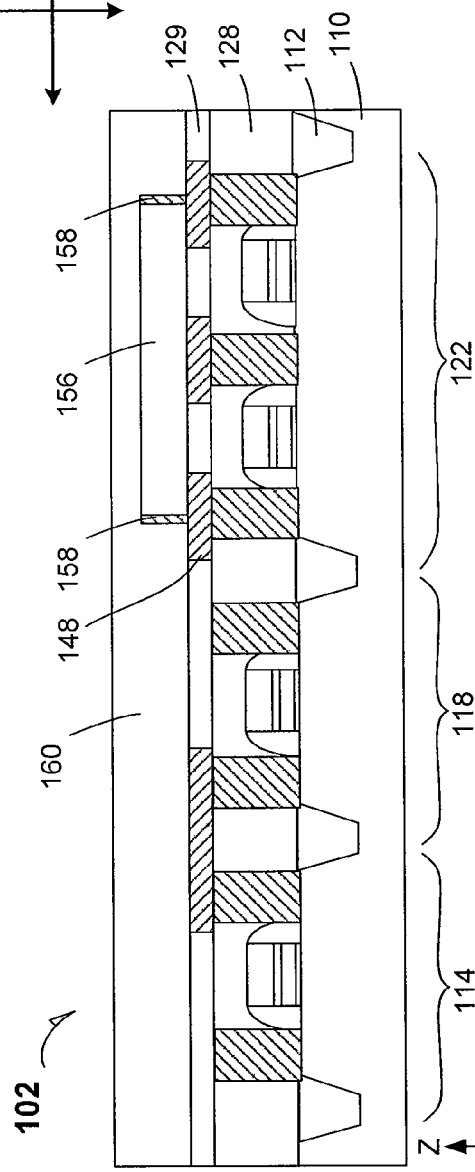
Fig. 1c
Fig. 1d
Fig. 1e

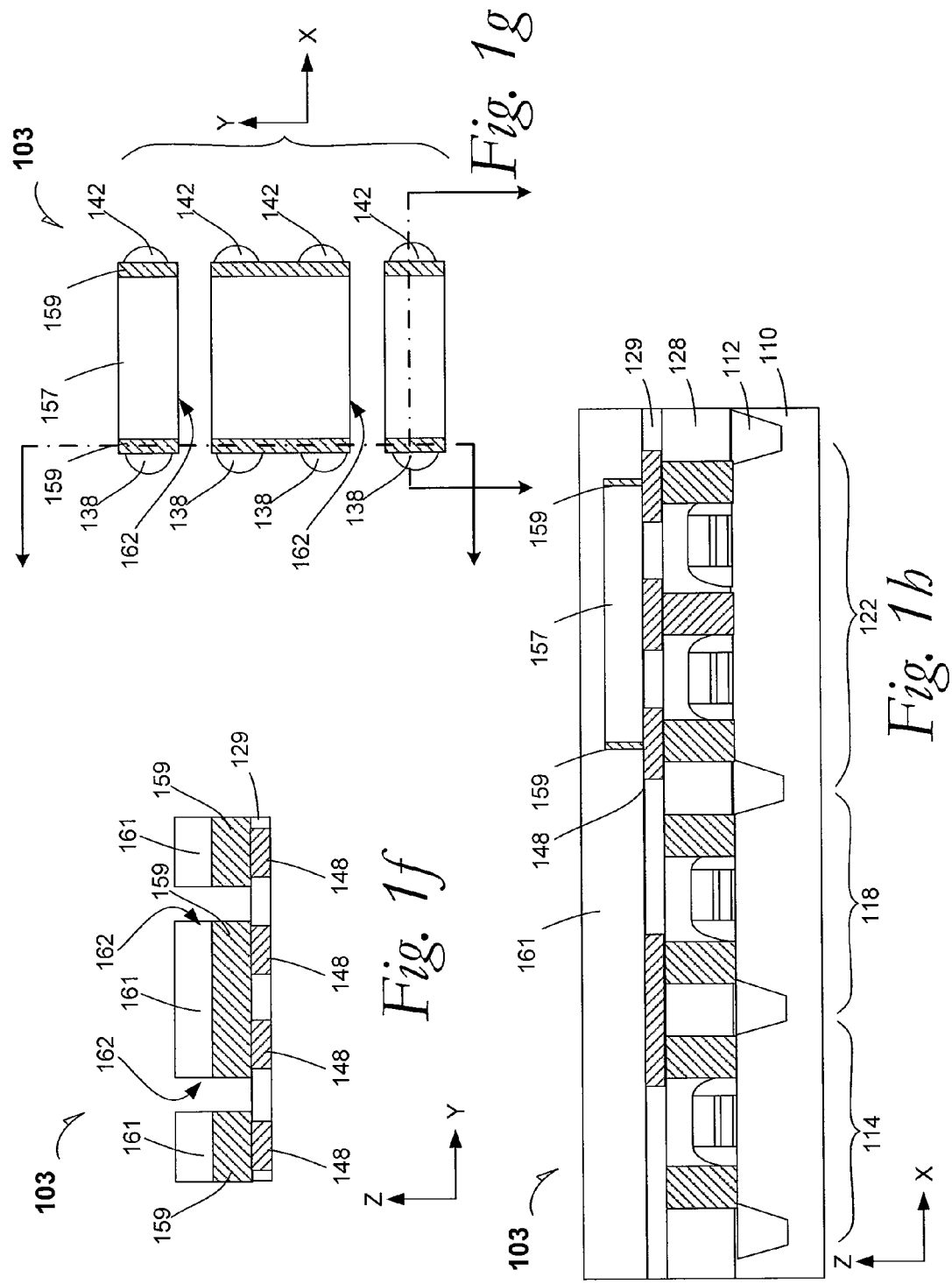

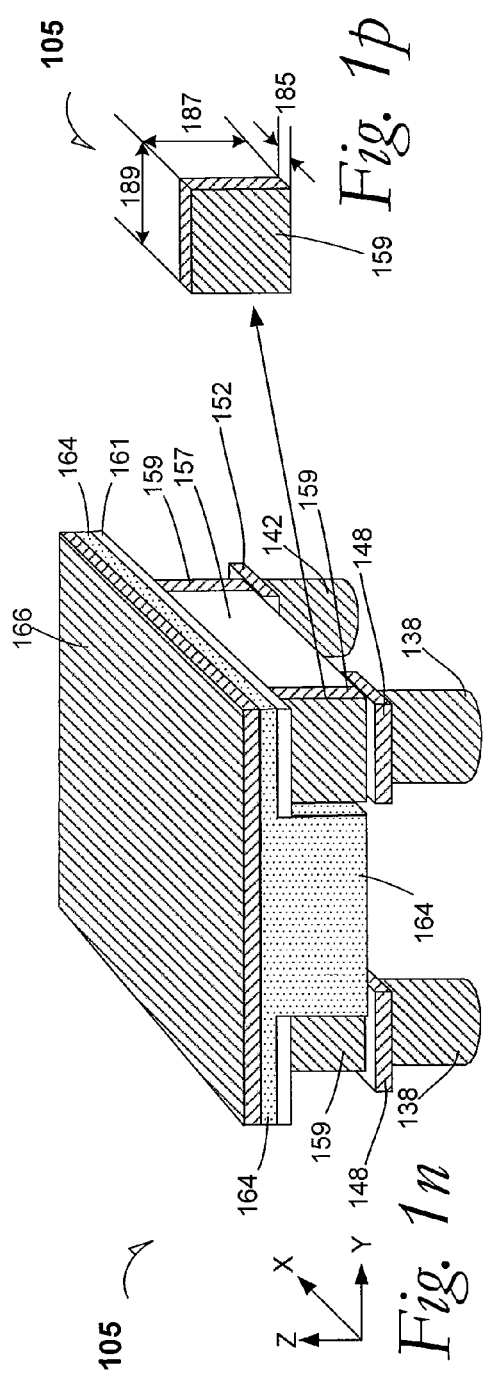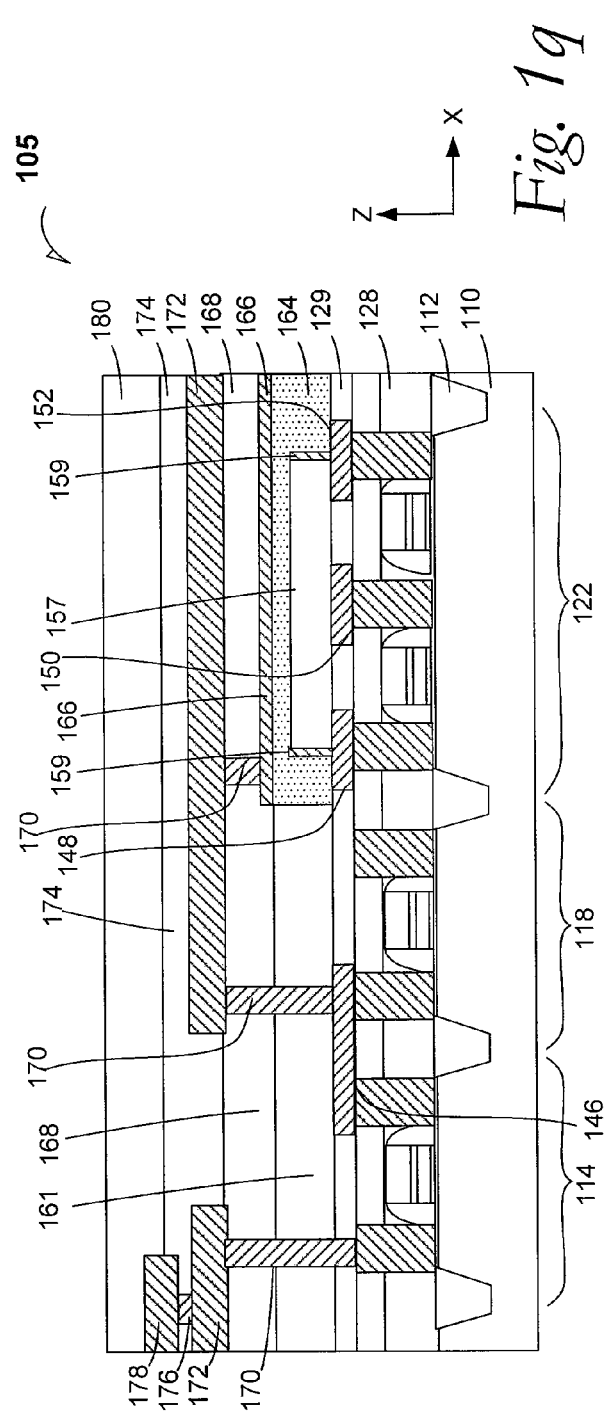

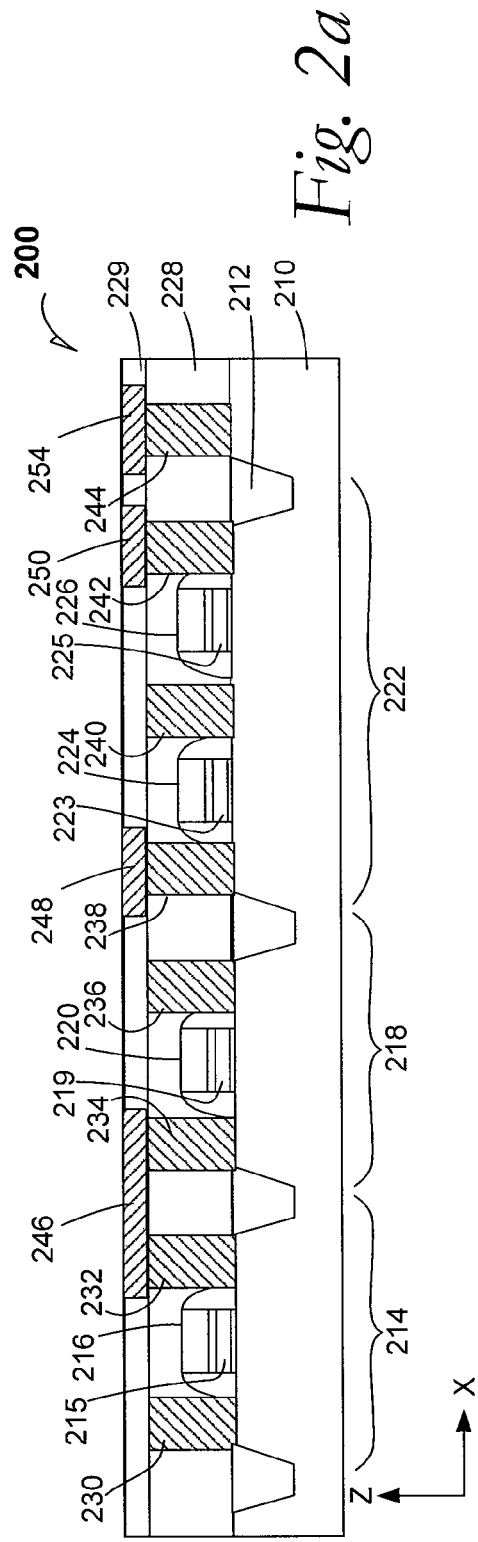

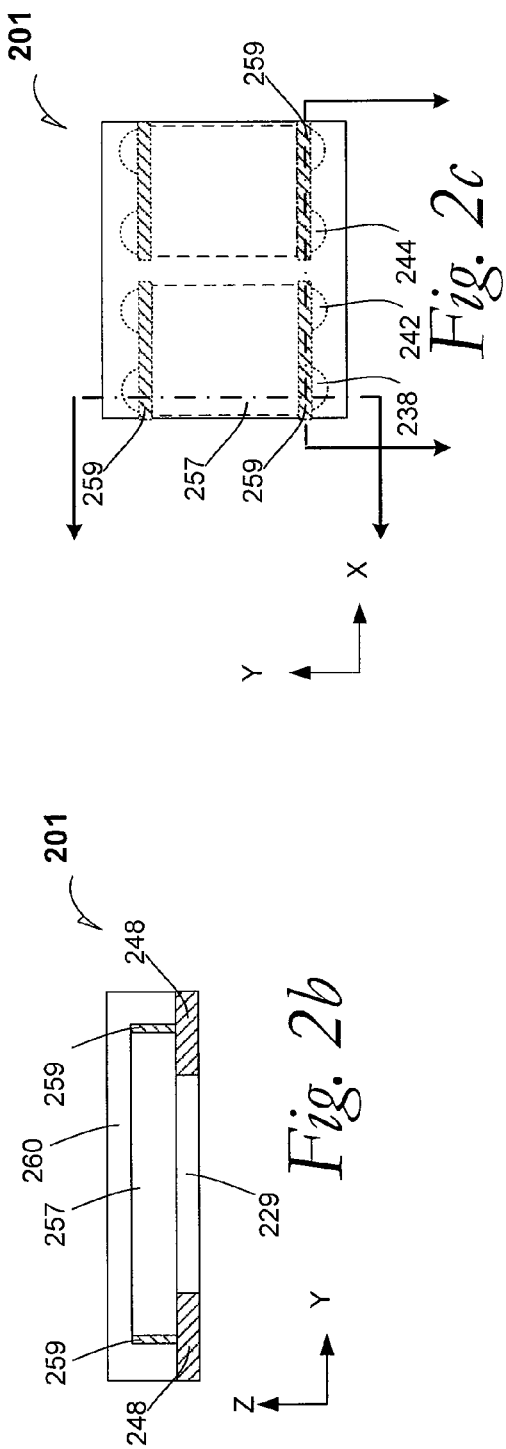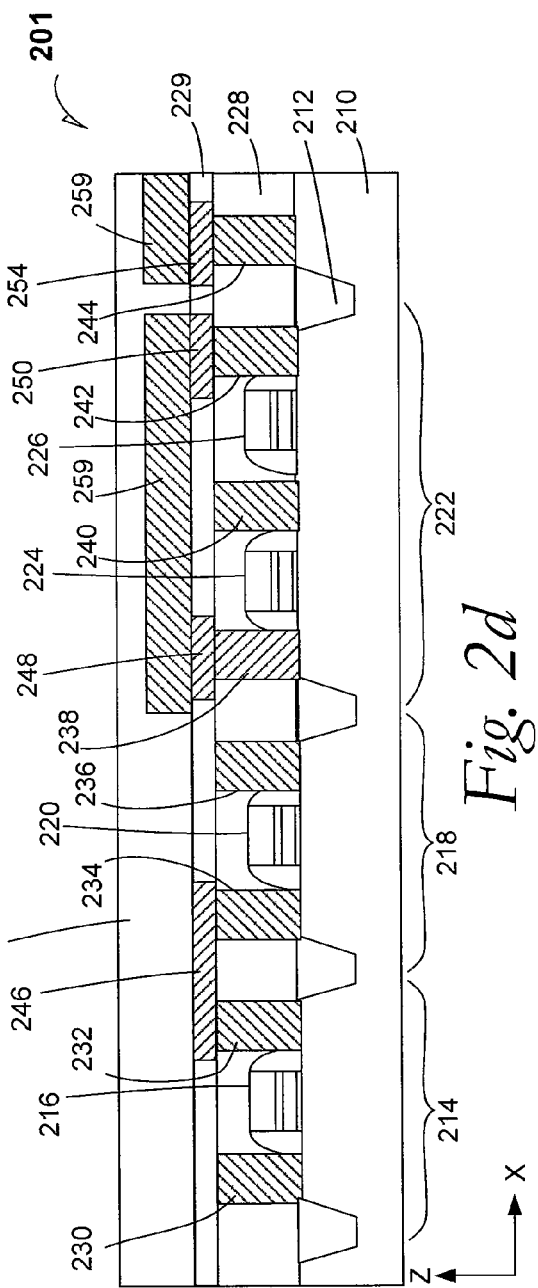

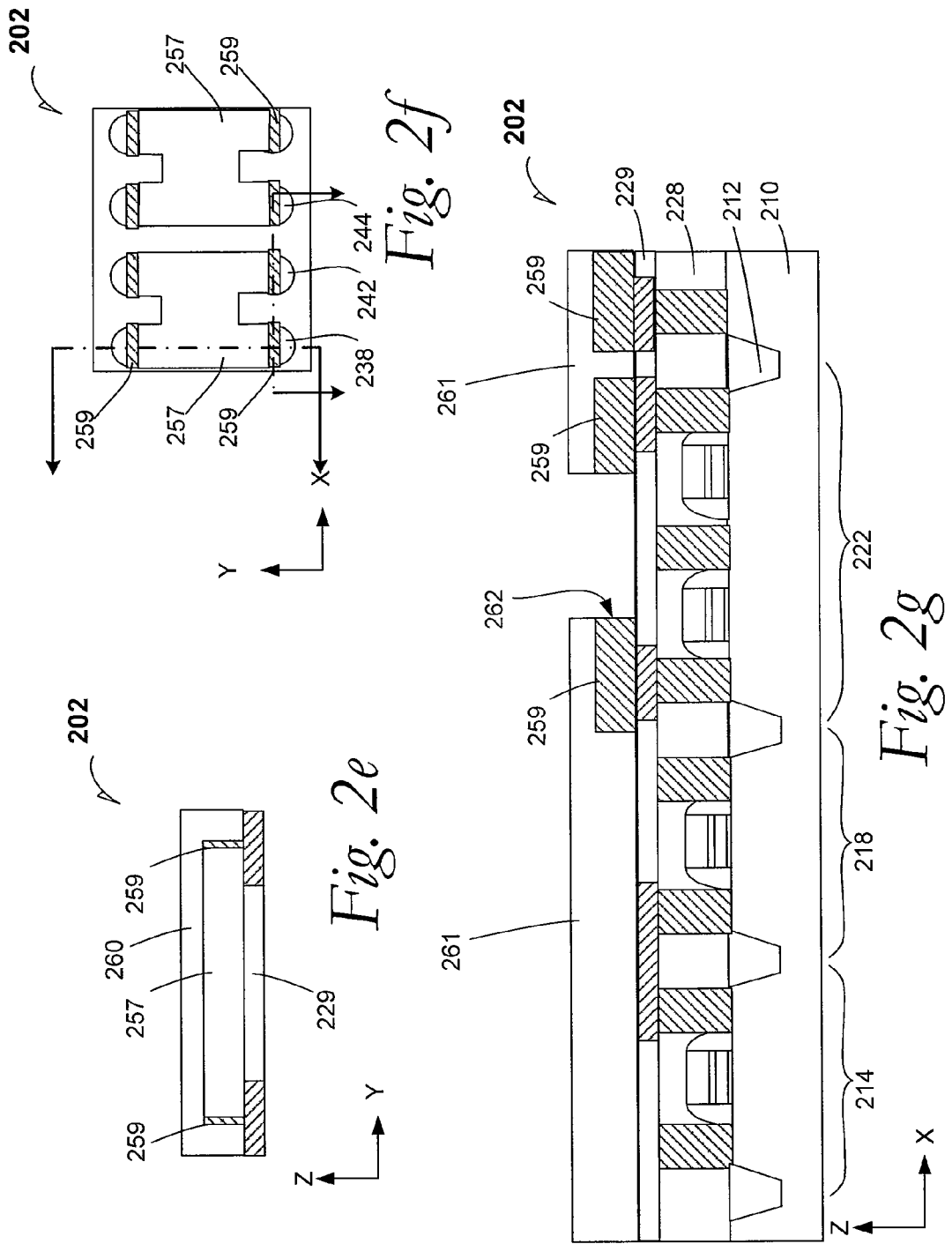

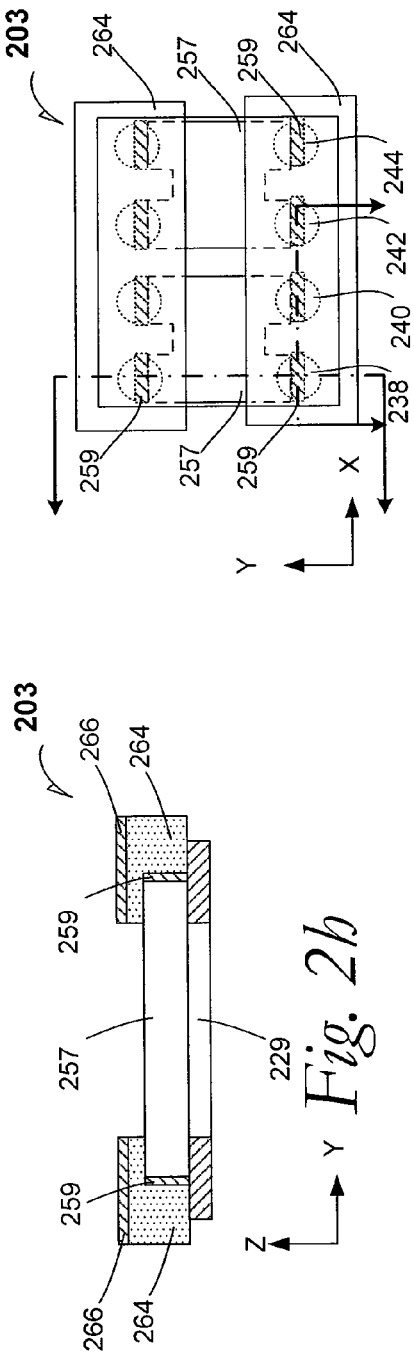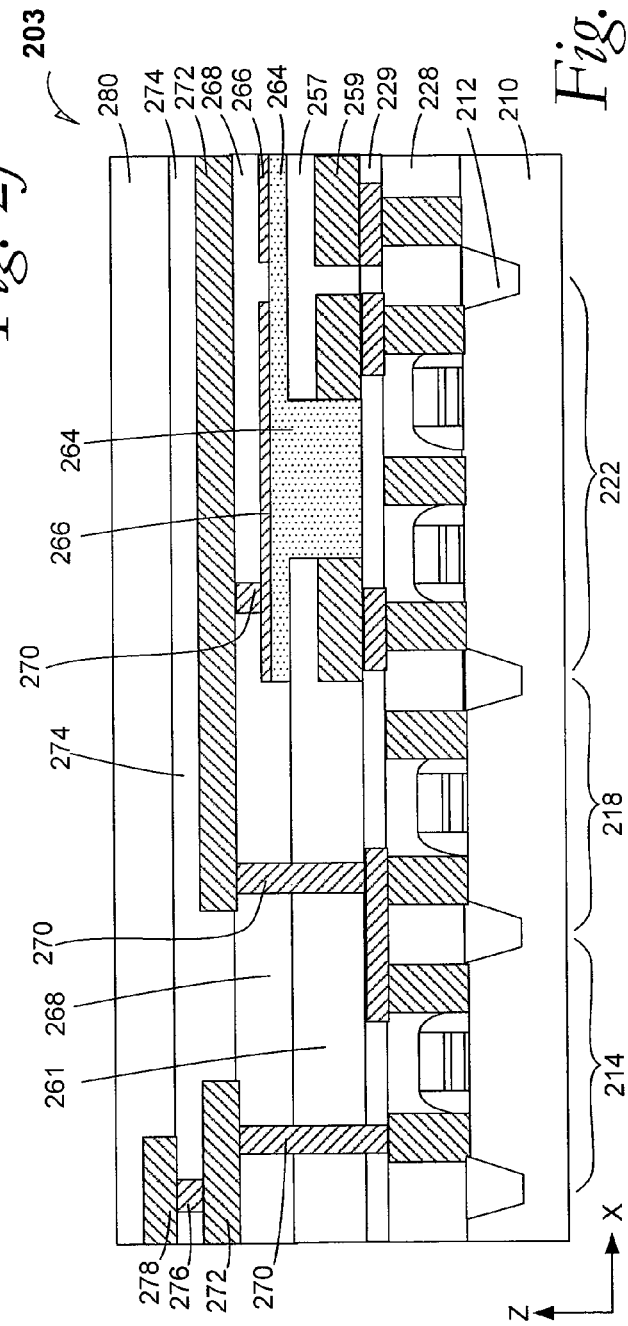

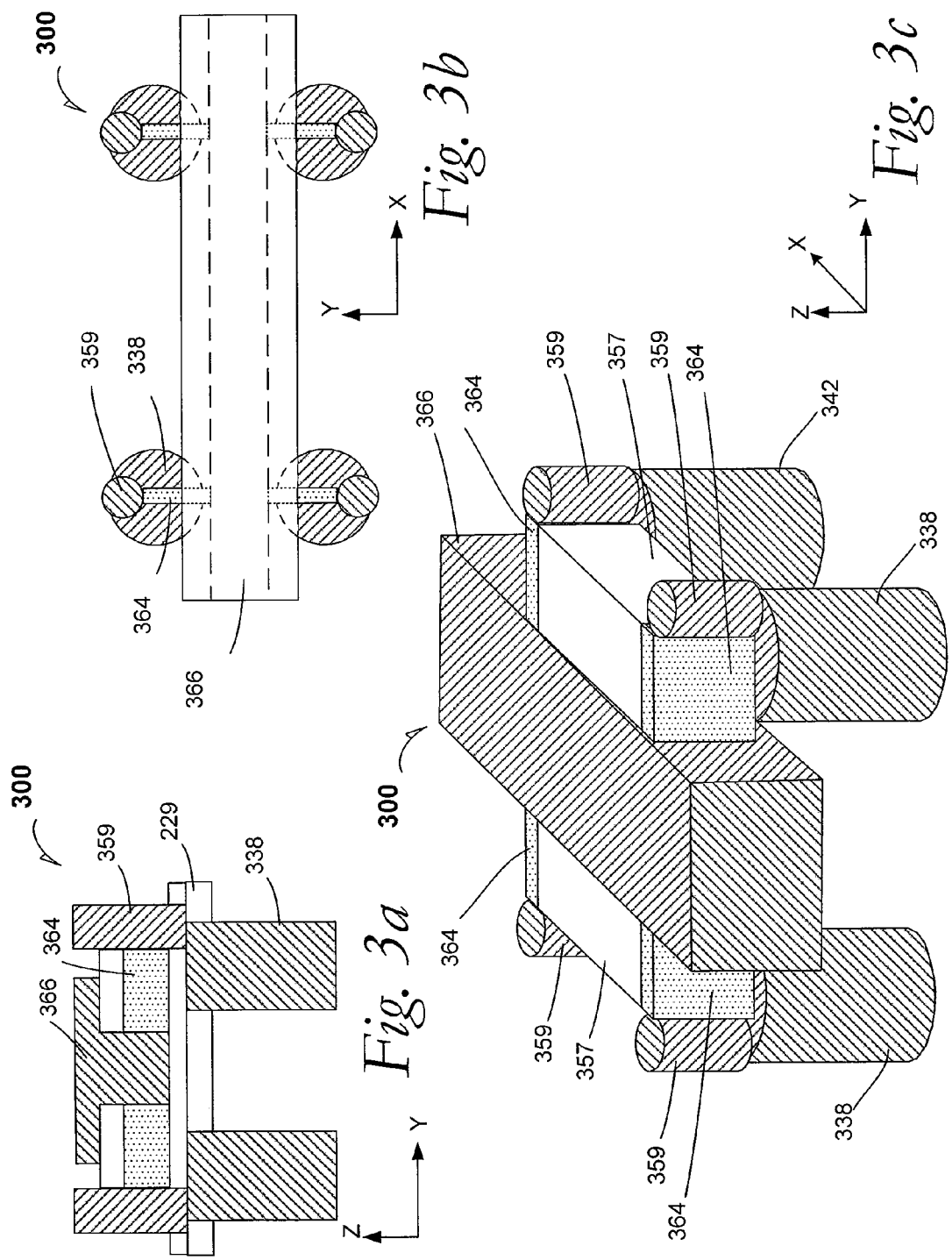

VARIABLE-RESISTANCE MATERIAL MEMORIES AND METHODS

PRIORITY APPLICATION

This application is a continuation of U.S. application Ser. No. 13/723,757, filed Dec. 21, 2012, which is a continuation of U.S. application Ser. No. 12/014,867, filed Jan. 16, 2008, now issued as U.S. Pat. No. 8,338,812, all of which are incorporated herein by reference in their entirety.

TECHNICAL FIELD

This disclosure relates generally to variable-resistance material random-access memories.

BACKGROUND

During miniaturization processes, scaling analysis suggests programming current scales approximately linearly with the bottom electrode contact area for phase change memory. The requirement for sufficient current poses a challenge to the bottom electrode contact area during miniaturization. What is needed are methods to form better structures that can address these challenges. Also needed are improved variable-resistance material random-access memory structures that can also address these challenges.

BRIEF DESCRIPTION OF THE DRAWINGS

The previously mentioned issues are addressed by the present disclosure and will be understood by reading and studying the following specification, of which the figures are a part.

FIG. 1a shows a cross-section elevation of a semiconductor device during fabrication according to an embodiment;

FIG. 1b shows a cross-section elevation of the semiconductor device depicted in FIG. 1a after further processing according to an embodiment;

FIGS. 1c, 1d, and 1e show two cross-section elevations and one cut-away top plan of the semiconductor device depicted in FIG. 1b after further processing according to an embodiment;

FIGS. 1f, 1g, and 1h show two cross-section elevations of the semiconductor device depicted in FIGS. 1c, 1d, and 1e after further processing according to an embodiment;

FIGS. 1n, 1p, and 1q show cross-section elevation and a cut-away perspective of the semiconductor device depicted in FIGS. 1j, 1k, and 1m after further processing according to an embodiment;

FIG. 2a shows a cross-section elevation of a semiconductor device during fabrication according to an embodiment;

FIGS. 2b, 2c, and 2d show two cross-section elevations and one cut-away top plan of the semiconductor device depicted in FIG. 2a after further processing according to an embodiment;

FIGS. 2e, 2f, and 2g show two cross-section elevations and a top plan of the semiconductor device depicted in FIGS. 2b, 2c, and 2d after further processing according to an embodiment;

FIGS. 2h, 2j, and 2k show two cross-section elevations and a top plan of the semiconductor device depicted in FIGS. 2e, 2f, and 2g during further fabrication according to an embodiment;

FIGS. 3a, 3b, and 3c show two cross-section elevations and a cut-away perspective elevation of a semiconductor device according to an embodiment;

DETAILED DESCRIPTION

Figure 1K:
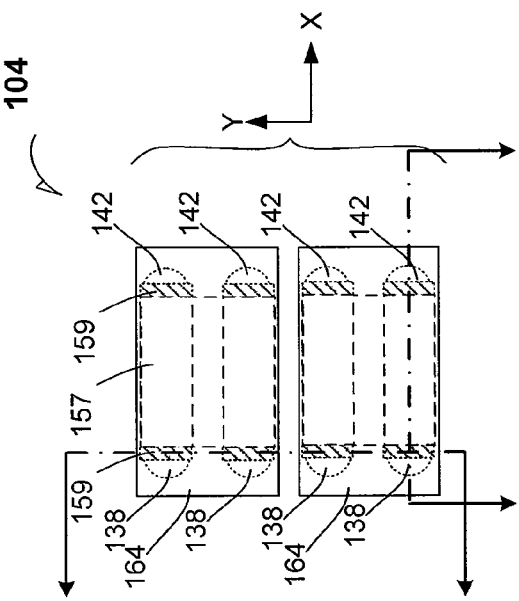
FIGS. 1j, 1k, and 1m show two cross-section elevations and a top plan of the semiconductor device depicted in FIGS. 1f, 1g, and 1h during further fabrication according to an embodiment.

The embodiments of a device, an apparatus, or an article described herein can be manufactured, used, or shipped in a number of positions and orientations. A variable-resistance material memory (VRMM) device may include a material such as an alloy. A VRMM device may include a material such as a quasi-metal composition. A VRMM device may include materials such as metal oxides. A VRMM device may include materials such as chalcogenides. These several materials can be very diverse in quality and performance.

FIG. 1a shows a cross-section elevation of a semiconductor device 100 during fabrication according to an embodiment. The semiconductor device 100 may be used in a memory device, and particularly for a VRMM device such as a chalcogenide material memory device.

A semiconductive substrate 110 has been patterned, etched, and filled with several shallow-trench isolation (STI) structures 112. Additionally, portions of the semiconductive substrate 110 are formed with an n-channel periphery 114 that includes a gate stack 116 with a word line 115. Further, the semiconductive substrate 110 is formed with a p-channel periphery 118 that includes a gate stack 120 with a word line 119. And further, the semiconductive substrate 110 is also formed with an array region 122 that includes two gate stacks 124 and 126 with respective word lines 123 and 125.

Preparation of the semiconductive substrate 110 may include initial doping to form each of the n-channel periphery 114, the p-channel periphery 118, and the array region 122. Processing may also include simultaneous formation of the several word lines 115, 119, 123, and 125.

FIG. 1b shows a cross-section elevation of the semiconductor device depicted in FIG. 1a after further processing according to an embodiment. The semiconductor device 101 has been processed with a dielectric first film 128, and several contacts 130, 132, 134, 136, 138, 140, and 142 have been located to contact the semiconductive substrate 110 at various locations. Further, contact pads 146, 148, 150, and 152 have also been connected to several of the contacts 132 and 134, 136, 138, and 140, respectively. In an embodiment, the contact pad 150 may be part of a buried digit line (BDL). Processing may also include formation of a dielectric second film 129 that is about planar or about flush with the contact pads 146, 148, 150, and 152.

FIGS. 1c, 1d, and 1e show two cross-section elevations and one cut-away top plan of the semiconductor device depicted in FIG. 1b after further processing according to an embodiment.

The semiconductor device 102 has been processed to form a dielectric mesa 156. In an embodiment, a dielectric layer is deposited by chemical vapor deposition (CVD), followed by a dry etch to result in the dielectric mesa 156 as depicted. Further processing has included forming and spacer etching of an electrode material to form a bottom spacer electrode 158. In an embodiment, the bottom spacer electrode 158 is a metal such as tungsten. In an embodiment, the bottom spacer electrode 158 is a metal nitride such as titanium nitride. Other metal nitrides or compounds may be used.

In the X-Z cross section, the dielectric mesa 156 displays the bottom spacer electrode 158 edge-on. In the Y-Z cross section, the dielectric mesa 156 may be obscured by the bottom spacer electrode 158 as illustrated, and a plurality of contact pads 148 are depicted as being in contact with the bottom spacer electrode 158. In the top plan (X-Y), a plurality of contacts 138 and 142 are seen below the bottom spacer electrodes 158. The plurality of contact pads 148 and 152 is depicted in phantom lines where they are obscured by other structures. The dielectric mesa 156 and the bottom spacer electrode 158 may next be overlaid with an interlayer dielectric (ILD) 160 to assist in further processing.

FIGS. 1f, 1g, and 1h show two cross-section elevations and a top plan of the semiconductor device depicted in FIGS. 1c, 1d, and 1e after further processing according to an embodiment. The semiconductor device 103 has been processed such that the ILD 160 (FIG. 1c) has been formed into a patterned ILD 161 as depicted in the X-Z and Y-Z cross-section elevations. Patterning also may include a dry etch that segments the bottom spacer electrode 158 (FIG. 1c) into the bottom spacer electrodes 159 as depicted. Patterning may also include segmenting the dielectric mesa 156 (FIG. 1c) into the dielectric mesas 157 as depicted.

As a consequence of the patterning that forms the bottom spacer electrodes 159, trenches 162 are formed that in part become the repositories for a VRMM cell.

Figure 1J:
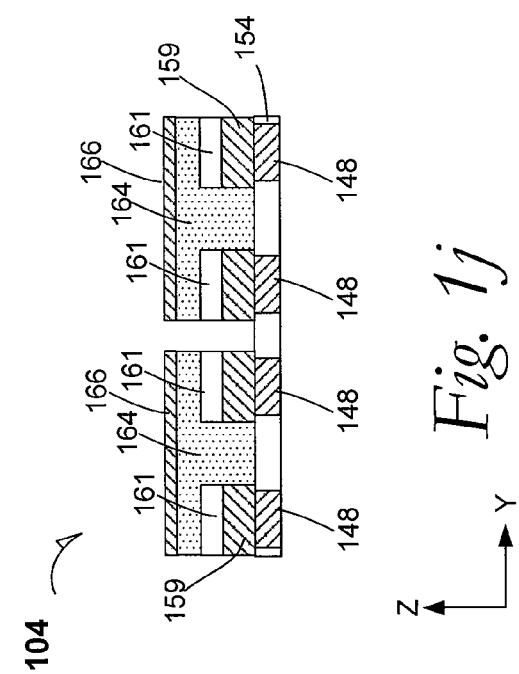
Figure 1M:
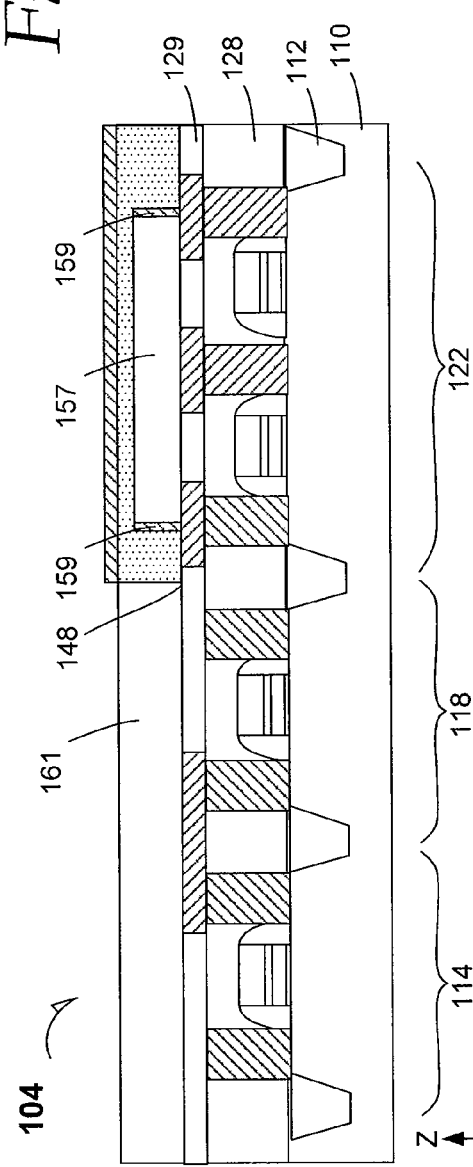

FIGS. 1j, 1k, and 1m show two cross-section elevations and a top plan of the semiconductor device depicted in FIGS. 1f, 1g, and 1h during further fabrication according to an embodiment. The semiconductor device 104 has been processed such that the ILD 161 is overlaid and the trenches 162 (FIG. 1d) are filled with a VRMM to form a VRMM cell 164. FIG. 1j also shows a top electrode 166 that overlies the VRMM cell 164. In an embodiment, photolithography and an in situ dry etch are carried out to define memory cells such as that delineated by the VRMM cell 164.

FIGS. 1n, 1p, and 1q show cross-section elevations and a cut-away perspective of the semiconductor device depicted in FIGS. 1h, 1k, and 1m after further processing according to an embodiment. The semiconductor device 105 has been processed such that the top electrode 166 has been overlaid with a second ILD 168 (FIG. 1q). An etch has allowed Metal-1 interconnects 170 to couple various parts of the semiconductor device 105 to the outside world including what has become a local interconnect 146 that straddles the n-channel periphery 114 and the p-channel periphery 118. A Metal-1 interconnect 170 also couples the top electrode 166. Thereafter, Metal-1 traces 172 are formed to contact the Metal-1 interconnects 170, and a third ILD 174 is formed to allow a Metal-2 interconnect 176 to couple a Metal-2 trace 178 to the n-channel periphery 114. An upper dielectric 180 is depicted as covering the Metal-2 trace 178.

Electrical contact between the bottom spacer electrode 159 and top electrode 166 is made edge-on with the VRMM cell 164. The detail extract of the VRMM cell 164, FIG. 1p, shows the edge-on dimension 185, which is referred to herein as the minor-axis dimension 185. The detail extract also shows a first major-axis dimension 187, and a second major-axis dimension 189. In several embodiments, the first major-axis dimension 187 is larger than the minor-axis dimension 185, but smaller than the second major-axis dimension 189.

As illustrated, the VRMM cell 164 is contacted by the bottom spacer electrode 159 only at the minor-axis dimension 185. This orientation may allow for an electrode footprint that is significantly smaller than the smallest feature achievable by the photolithography capabilities at the time of fabrication. Consequently, the electrode footprint may significantly reduce cell sizes. The effect may also reduce programming current requirements.

Similarly, the height of the dielectric mesa 157 can be varied to adjust total mass and form factor of the VRMM cell 164 and also to adjust the programming current requirement. Where height may be at a premium, the major-axis dimension may be along the Y-axis.

FIG. 2a shows a cross-section elevation of a semiconductor device 200 during fabrication according to an embodiment. The semiconductor device 200 may be used in memory device, and particularly for a variable-resistance material memory (VRMM) device such as a chalcogenide material memory device.

A semiconductive substrate 210 has been patterned, etched, and filled with several STI structures 212. Additionally, portions of the semiconductive substrate 210 are formed with an n-channel periphery 214 that includes a gate stack 216 with a word line 215. Further, the semiconductive substrate 210 is formed with a p-channel periphery 218 that includes a gate stack 220 with a word line 219. And further, the semiconductive substrate 210 is also formed with an array region 222 that includes two gate stacks 224 and 226 with respective word lines 223 and 225.

Preparation of the semiconductive substrate 210 may include initial doping to form each of the n-channel periphery 214, the p-channel periphery 218, and the array region 222. Processing may also include simultaneous formation of the several word lines 215, 219, 223, and 225.

The semiconductor device 201 has also been processed with a dielectric first film 228, and several contacts 230, 232, 234, 236, 238, 240, 242, and 244 have been located to contact the semiconductive substrate 210 at various locations. Further, contact pads 246, 248, 250, and 254 have also been connected to several of the contacts 232 and 234, 238, 242, and 244, respectively. In an embodiment, the contact 240 may be part of a BDL structure. Processing may also include formation of a dielectric second film 229 that is planar with the contact pads 246, 248, 250, and 254.

FIGS. 2b, 2c, and 2d show two cross-section elevations and one cut-away top plan of the semiconductor device depicted in FIG. 2a after further processing according to an embodiment. The semiconductor device 201 has been processed to form a dielectric mesa 257. In an embodiment, a dielectric layer is formed by CVD, followed by a dry etch to result in the dielectric mesa 257 as depicted. Further processing has included forming and spacer etching of an electrode material to form a bottom spacer electrode 259. In an embodiment, the bottom spacer electrode 259 is a metal such as tungsten. In an embodiment, the bottom spacer electrode 259 is a metal nitride such as titanium nitride. Other metal nitrides or compounds may be used.

In the X-Z cross-section elevation, the dielectric mesa 257 may be obscured by the bottom spacer electrode 259 as illustrated. This cross-section elevation displays the bottom spacer electrode 259 along a major-axis dimension. In the Y-Z cross section elevation, the dielectric mesa 257 is viewed with the bottom spacer electrode 259 displayed edge-on along the minor-axis dimension. A plurality of contact pads 248 are depicted as being in contact with the bottom spacer electrode 259. In the top plan (X-Y), a plurality of contacts 238, 240, 242, and 244 are seen below the bottom spacer electrodes 259. The plurality of contact pads 248, 250, and 254 is not depicted in the top plan for clarity. The dielectric mesa 257 and the bottom spacer electrode 259 may next be overlaid with an ILD 260 to assist in further processing. The ILD 260 may also isolate the top of the spacer electrode 259 from contacting the VRMM cell.

FIGS. 2e, 2f, and 2g show two cross-section elevations and a top plan of the semiconductor device depicted in FIGS. 2b, 2c, and 2d after further processing according to an embodiment. The semiconductor device 202 has been processed such that the ILD 260 (FIG. 2b) has been formed into a patterned ILD 261 as depicted in the X-Z and Y-Z cross-section elevations. Patterning also may include a dry etch that results in a trench 262 that in part becomes the repository for a VRMM cell.

FIGS. 2h, 2j, and 2k show two cross-section elevations and a top plan of the semiconductor device depicted in FIGS. 2e, 2f, and 2g during further fabrication according to an embodiment. The semiconductor device 203 has been processed such that the patterned ILD 261 is overlaid and the trenches 262 (FIG. 2c) are filled with a VRMM material to form a VRMM cell 264. FIG. 2h also shows a top electrode 266 that overlies the VRMM cell 264. In an embodiment, photolithography and an in situ dry etch are carried out to define memory cells such as that delineated by the VRMM cell 264.

FIG. 2k also illustrates further processing according to an embodiment, such that the top electrode 266 has been overlaid with a second ILD 268. An etch has allowed Metal-1 interconnects 270 to couple various parts of the semiconductor device 203 to external structures. A Metal-1 interconnect 270 also couples the top electrode 266 to lower structures. Thereafter, Metal-1 traces 272 are formed to contact the Metal-1 interconnects 270, and a third ILD 274 is formed to allow a Metal-2 interconnect 276 to couple a Metal-2 trace 278 to the n-channel periphery 214. An upper dielectric 280 is depicted as covering the Metal-2 trace 278.

One characteristic of the VRMM cell 264 in contrast with the VRMM cell 164 of FIGS. 1a-1f is that it is easier to select a single bit in an array of VRMM cells.

FIGS. 3a, 3b, and 3c show two cross-section elevations and a cut-away perspective elevation of a semiconductor device 300 according to an embodiment. The semiconductor device 300 in the perspective elevation depicts first contacts 338 and second contacts 342. Various dielectric structures are omitted for clarity. A dielectric mesa 357 is illustrated as having been patterned, and a VRMM spacer cell 364 is formed by depositing VRMM material over the dielectric mesa 357, followed by a spacer etch. Electrical contact to the VRMM spacer cell 364 includes a first electrode 359 and a second electrode 366. The first electrode 359 may be considered to be analogous to a bottom electrode, and the second electrode 366 may be considered to be analogous to a top electrode. In an embodiment, the first electrode 359 is made of a metal such as tungsten. In an embodiment, the first electrode 359 is made of a metal nitride such as titanium nitride. Other metal nitrides or compounds may be used.

In the Y-Z elevation, the VRMM spacer cell 364 is seen as making contact between the first electrode 359 and the second electrode 366 along the minor-axis dimension. In the X-Y top plan, the VRMM spacer cell 364 is seen to be overlapped in part by the second electrode 366.

Other structures such as ILDs, contacts, traces, etc. may be installed similarly to the structures illustrated in FIGS. 1f and 2d.

In an embodiment, the variable-resistance material that may be used as a phase-change random-access memory (PCRAM) cell is a gallium (Ga) containing material, and may include Ga—Sb, Ga—Ge—Sb, Ga—Se—Te, and others. In some gallium-containing phase-change material embodiments, the gallium is present in a majority amount (greater than or equal to 50 percent). In some gallium-containing phase-change material embodiments, the gallium is present in a plurality amount (gallium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a phase-change random-access memory (PCRAM) cell is a germanium (Ge) containing material, and may include Ge—Te, Ge—Sb—Te, Ge—Te—As, Ge—Se—Ga, Ge—In—Sb, Ge—Te—Sb—S, Ge—Te—SnO, Ge—Te—Sn—Au, Ge—Pd—Te—Sn, Ge—Sb—Te—Pd, Ge—Sb—Te—Co, Ge—Sb—Se—Te, Ge—Sn—Te, Ge—Te—Sn—Ni, Ge—Te—Sn—Pd, Ge—Te—Sn—Pt, and others. In some germanium-containing phase-change material embodiments, the germanium is present in a majority amount (greater than or equal to 50 percent). In some germanium-containing phase-change material embodiments, the germanium is present in a plurality amount (germanium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is an indium (In) containing material, and may include In—Se, In—Sb, In—Sb—Te, In—Sb—Ge, In—Se—Ti—Co, In—Ag—Sb—Te, and others. In some indium-containing phase-change material embodiments, the indium is present in a majority amount (greater than or equal to 50 percent). In some indium-containing phase-change material embodiments, the indium is present in a plurality amount (indium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is an antimony (Sb) containing material, and may include $Sb_2Te_3$, Sb—Ga, Sb—Bi—Se, Sb—Sn—Te, Sb—In—Ge, Sb—Te—Ge—S, Sb—Ge—Te—Pd, Sb—Ge—Te—Co, Sb—Te—Bi—Se, Sb—Ag—In—Te, Sb—Ge, Sb—Ge—Se—Te, Sb—Ge—Sn—Te, and others. In some antimony-containing phase-change material embodiments, the antimony is present in a majority amount (greater than or equal to 50 percent). In some antimony-containing phase-change material embodiments, the antimony is present in a plurality amount (antimony being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a tellurium (Te) containing material, and may include Te—Ge, Te—Sb, Te—As, Te—Al, Te—Ge—Sb, Te—Ge—As, Te—In—Sb, Te—Sn—Se, Te—Ga—Se, Te—Sn—Sb, Te—Ge—Sb—S, Te—Ge—Sn—O, Te—Ge—Sn—Au, Te—Pd—Ge—Sn, Te—Ge—Sb—Pd, Te—Ge—Sb—Co, Te—Sb—Bi—Se, Te—Ag—In—Sb, Te—Ge—Ab—Se, Te—Ge—Sn—Sb, Te—Ge—Sn—Ni, Te—Ge—Sn—Pd, Te—Ge—Pd—Pt and others. In some tellurium-containing phase-change material embodiments, the tellurium is present in a majority amount (greater than or equal to 50 percent). In some tellurium-containing phase-change material embodiments, the tellurium is present in a plurality amount (tellurium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a selenium (Se) containing material, and may include Se—In, Se—Te—Sn, Se—Ge—Ga, Se—Bi—Sb, Se—Ga—Te, Se—In—Ti—Co, Se—Sb—Te—Bi, Se—Ge—Sb—Te, and others. In some selenium-containing phase-change material embodiments, the selenium is present in a majority amount (greater than or equal to 50 percent). In some selenium-containing phase-change material embodiments, the selenium is present in a plurality amount (selenium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is an arsenic (As) containing material, and may include As—Te, As—Te—Ge, and others. In some arsenic-containing phase-change material embodiments, the arsenic is present in a majority amount (greater than or equal to 50 percent). In some arsenic-containing phase-change material embodiments, the arsenic is present in a plurality amount (arsenic being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is an aluminum (Al) containing material. Selected aluminum-containing materials that may be used include Al—Te, Al—Se and others. In some aluminum-containing phase-change material embodiments, the aluminum is in a majority amount.

In an embodiment, the variable-resistance material that may be used as a PCRAM cell is a tin (Sn) containing material, and may include Sn—Te—Se, Sn—Sb—Te, Sn—Te—Ge—O, Sn—Pd—Te—Ge, Sn—Ge—Sb—Te, Sn—Ge—Sb—Te, Sn—Ge—Te—Ni, Sn—Ge—Te—Pd, Sn—Ge—Te—Pt, and others. In some tin-containing phase-change material embodiments, the tin is present in a majority amount (greater than or equal to 50 percent). In some tin-containing phase-change material embodiments, the tin is present in a plurality amount (tin being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a palladium (Pd) containing material, and may include Pd—Te—Ge—Sn, Pd—Ge—Sb—Te, and others. In some palladium-containing phase-change material embodiments, the palladium is present in a majority amount (greater than or equal to 50 percent). In some palladium-containing phase-change material embodiments, the palladium is present in a plurality amount (palladium being the most prevalent element). In some embodiments, the first-listed element is present in either a majority or plurality amount, and the subsequent-listed elements are listed by order of decreasing amounts on an elemental scale.

In an embodiment, the variable-resistance material that may be used as a PCRAM cell is a silver (Ag) containing material, and may include Ag—In—Sb—Te, and others. In some silver-containing phase-change material embodiments, the silver is present in a majority amount (greater than or equal to 50 percent). In some silver-containing phase-change material embodiments, the silver is present in a plurality amount (silver being the most prevalent element). In some embodiments, the first-listed element is present in either a majority or plurality amount, and the subsequent-listed elements are listed by order of decreasing amounts on an elemental scale.

In an embodiment, a variable-resistance material may include one of various materials used to form so-called "colossal magnetoresistive films" such as, for example, $Pr_{(1-x)}Ca_xMnO_3$ (PCMO), $La_{(1-x)}Ca_xMnO_3$ (LCMO), and $Ba_{(1-x)}Sr_xTiO_3$.

In an embodiment, the variable-resistance material may include a binary or ternary doped or undoped oxide material such as, for example, $Al_2O_3$, $BaTiO_3$, $SrTiO_3$, $Nb_2O_5$, $SrZrO_3$, $TiO_2$, $Ta_2O_5$, NiO, $ZrO_x$, $HfO_x$, and $Cu_2O$.

In an embodiment, the variable-resistance material may have a Perovskite structure.

In an embodiment, the variable-resistance material includes a doped chalcogenide glass of the general formula $A_xB_y$, where B is selected from sulfur (S), selenium (Se), and tellurium (Te), and mixtures thereof, and where A includes at least one element from Group III-A (B, Al, Ga, In, Tl), Group IV-A (C, Si, Ge, Sn, Pb), Group V-A (N, P, As, Sb, Bi), or Group VII-A (F, Cl, Br, I, At), with one or more dopants selected from noble metal and transition metal elements such as, for example, Au, Ag, Pt, Cu, Cd, In, Ru, Co, Cr, Ni, Mn, and Mo.

Figure 4:
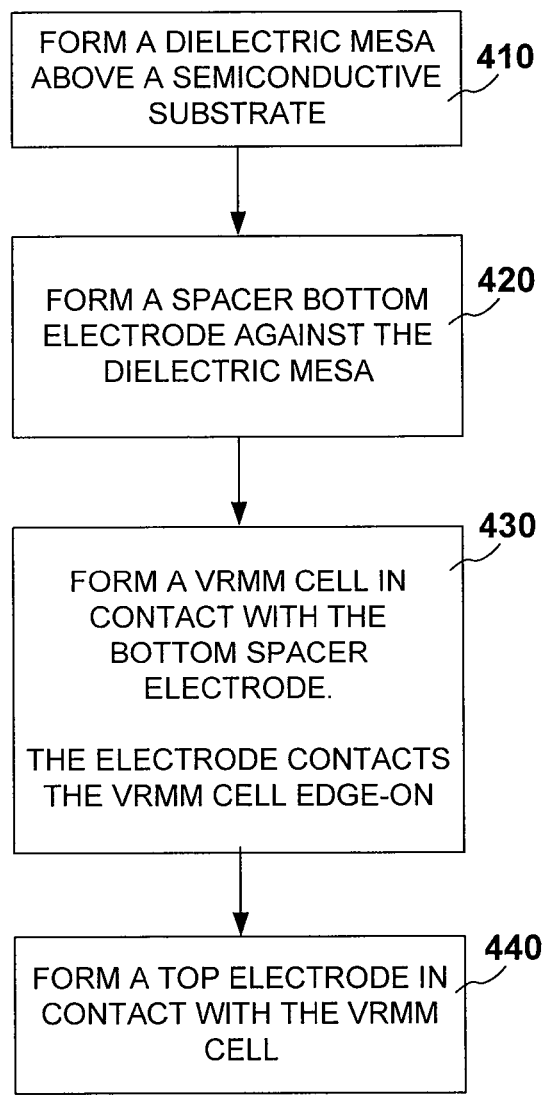
FIG. 4 is a process flow diagram for fabricating a variable-resistance material memory device according to an embodiment.

FIG. 4 is a process flow diagram 400 for fabricating a variable-resistance material memory device according to an embodiment. The process flow diagram 400 may illustrate fabrication technique embodiments for making the structures depicted in FIGS. 1a through 1g.

At 410, a dielectric mesa is formed above a semiconductive substrate.

At 420, a bottom spacer electrode is patterned and spacer etched against the dielectric mesa.

At 430, a VRMM cell is formed in contact with the bottom spacer electrode by filling VRMM material into a trench of a patterned ILD that exposes the bottom spacer electrode.

At 440, a top electrode is formed in contact with the VRMM cell. The VRMM cell and the top electrode may each be deposited and etched in situ. In an embodiment, the VRMM cell and the top electrode may be deposited sequentially, but etched simultaneously.

Figure 5:
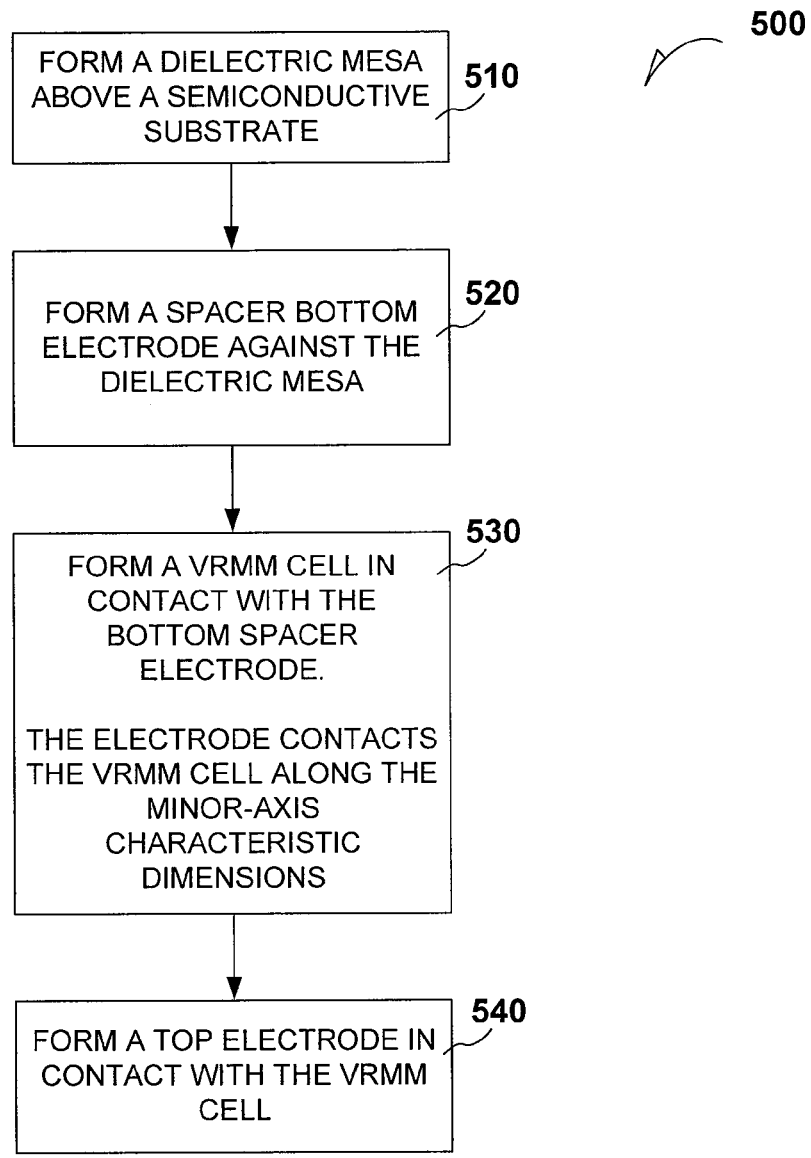
FIG. 5 is a process flow diagram for fabricating a variable-resistance material memory device according to an embodiment.

FIG. 5 is a process flow diagram 500 for fabricating a variable-resistance material memory device according to an embodiment. The process flow diagram 500 may illustrate fabrication technique embodiments for making the structures depicted in FIGS. 2a through 2d.

At 510, a dielectric mesa is formed above a semiconductive substrate.

At 520, a bottom spacer electrode is patterned and spacer etched against the dielectric mesa.

At 530, a VRMM cell is formed in contact with the bottom spacer electrode by filling VRMM material into a trench of a patterned ILD that exposes the bottom spacer electrode. In this process embodiment the VRMM cell is coupled to the bottom spacer electrode across the two major-axis dimensions.

At 540, a top electrode is formed in contact with the VRMM cell. The VRMM cell and the top electrode may each be deposited and etched in situ. In an embodiment, the VRMM cell and the top electrode may be deposited sequentially, but etched simultaneously.

Figure 6:
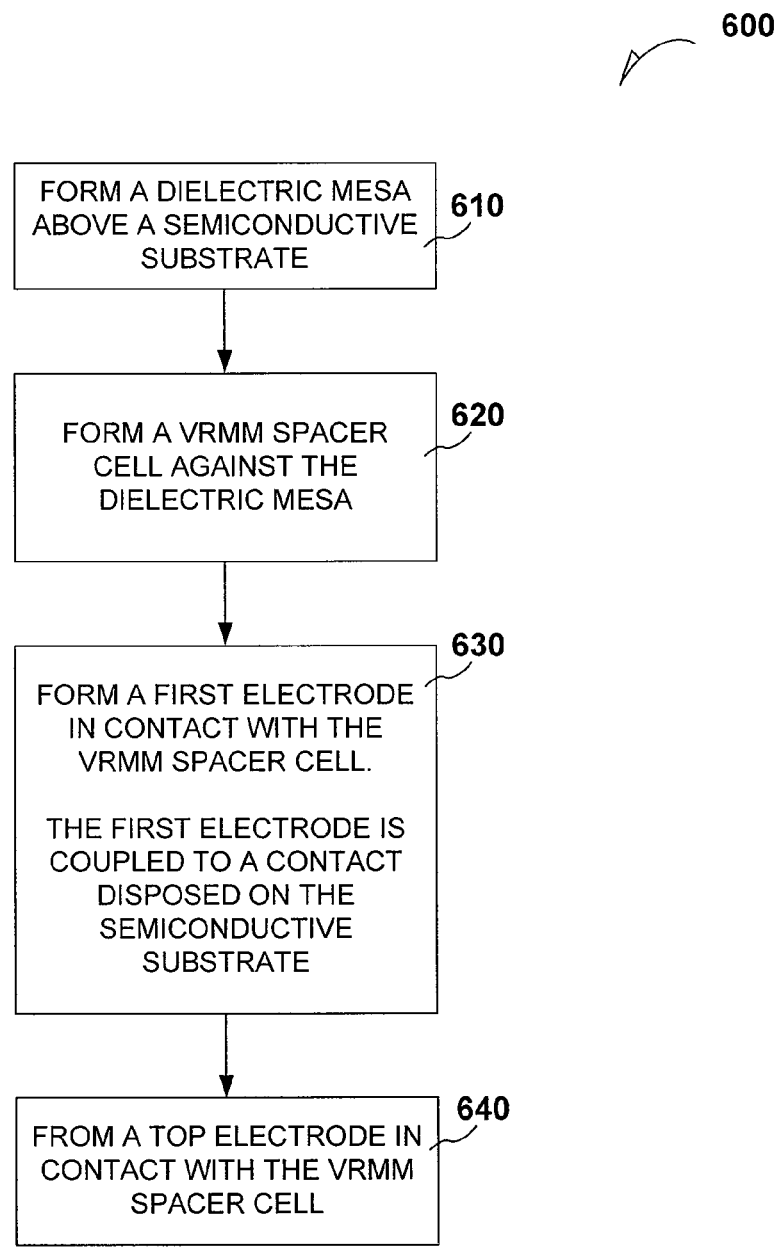
FIG. 6 is a process flow diagram for fabricating a variable-resistance material memory device according to an embodiment.

FIG. 6 is a process flow diagram 600 for fabricating a variable-resistance material memory device according to an embodiment. The process flow diagram 600 may illustrate fabrication technique embodiments for making the structures depicted in FIG. 3.

At 610, a dielectric mesa is formed above a semiconductive substrate.

At 620, a VRMM spacer cell is patterned and spacer etched against the dielectric mesa.

At 630, a first electrode is formed in contact with the VRMM spacer cell, and is also coupled to at least one contact disposed on the semiconductive substrate. In this process embodiment, the VRMM spacer cell is coupled to the first electrode across the minor-axis dimension.

At 640, a top electrode is formed in contact with the VRMM cell.

This Detailed Description refers to the accompanying drawings that show, by way of illustration, specific aspects and embodiments in which the present disclosure may be practiced. These embodiments are described in sufficient detail to enable those skilled in the art to practice the disclosed embodiments. Other embodiments may be used and structural, logical, and electrical changes may be made without departing from the scope of the present disclosure. The various embodiments are not necessarily mutually exclusive, as some embodiments can be combined with one or more other embodiments to form new embodiments.

The Detailed Description is, therefore, not to be taken in a limiting sense, and the scope of this disclosure is defined only by the appended claims, along with the full scope of equivalents to which such claims are entitled.

The terms "wafer" and "substrate" used in the description include any structure having an exposed surface with which to form an electronic device or device component such as a component of an integrated circuit (IC). The term substrate is understood to include semiconductor wafers. The term substrate is also used to refer to semiconductor structures during processing and may include other layers such as silicon-on-insulator (SOI), etc. that have been fabricated thereupon. Both wafer and substrate include doped and undoped semiconductors, epitaxial semiconductor layers supported by a base semiconductor or insulator, as well as other semiconductor structures well known to one skilled in the art.

The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The Abstract is provided to comply with 37 C.F.R. §1.72 (b), requiring an abstract that will allow the reader to quickly ascertain the nature of the technical disclosure. It is submitted with the understanding that it will not be used to interpret or limit the scope or meaning of the claims. In addition, in the foregoing Detailed Description, various features may be grouped together to streamline the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

What is claimed is:

1. A method of forming a memory device, comprising:
   forming a dielectric on a semiconductive substrate;
   forming a first electrode against the dielectric;
   forming a variable resistance material coupled to the first electrode, wherein a first minor-axis surface of the first electrode forms an interface with the variable resistance material, and wherein forming the variable resistance material coupled to the first electrode includes placing the variable resistance material in a trench adjacent to the first electrode; and
   forming a second electrode coupled to the variable resistance material.

2. The method of claim 1, wherein forming the dielectric includes forming a dielectric mesa.

3. The method of claim 1, wherein forming the first electrode includes forming a tungsten electrode.

4. The method of claim 1, wherein forming the first electrode includes forming a metal nitride electrode.

5. The method of claim 1, wherein forming the second electrode coupled to the variable resistance material includes etching the second electrode an the variable resistance material at the same time.

6. A method of forming a memory device, comprising:
   forming a dielectric on a semiconductive substrate;
   forming a first electrode against the dielectric, wherein forming the dielectric includes forming a dielectric mesa, and wherein forming the first electrode against the dielectric includes forming a pair of first electrodes on opposing sidewalls of the dielectric mesa;
   forming a variable resistance material coupled to the first electrode, wherein a first minor-axis surface of the first electrode forms an interface with the variable resistance material; and
   forming a second electrode coupled to the variable resistance material.

7. The method of claim 6, wherein forming the variable resistance material includes forming a variable resistance material in contact with another sidewall of the dielectric mesa normal to the opposing sidewalls.

8. A method of forming a memory device, comprising:
   forming a dielectric on a semiconductive substrate;
   forming a first electrode against the dielectric, wherein forming the dielectric includes forming a dielectric mesa, and wherein forming the dielectric mesa includes etching to leave a first electrode material on two ends of the dielectric mesa;
   forming a variable resistance material coupled to the first electrode, wherein a first minor-axis surface of the first electrode forms an interface with the variable resistance material; and
   forming a second electrode coupled to the variable resistance material.

9. A method of forming a memory device, comprising:
   forming a dielectric on a semiconductive substrate;
   forming a variable resistance material against the dielectric;
   forming a first electrode coupled to the variable resistance material, wherein a first minor-axis surface of the variable resistance material forms an interface with the first electrode; and
   forming a second electrode coupled to the variable resistance material.

10. The method of claim 9, wherein forming the dielectric includes forming a dielectric mesa.

11. The method of claim 10, wherein forming the variable resistance material against the dielectric includes forming a pair of variable resistance material portions on opposing sidewalls of the dielectric mesa.

12. The method of claim 11, wherein forming the second electrode includes forming a second electrode in contact with another sidewall of the dielectric mesa normal to the opposing sidewalls.

13. The method of claim 10, wherein forming the dielectric mesa includes etching to leave a variable resistance material portion on two ends of the dielectric mesa.

14. The method of claim 9, wherein forming the variable resistance material includes forming a variable resistance material containing gallium.

15. The method of claim 9, wherein forming the variable resistance material includes forming a variable resistance material containing germanium.

16. The method of claim 9, wherein forming the variable resistance material includes forming a variable resistance material containing indium.

17. The method of claim 9, wherein forming the variable resistance material includes forming a variable resistance material containing tellurium.

\* \* \* \* \*

UNITED STATES PATENT AND TRADEMARK OFFICE
CERTIFICATE OF CORRECTION

PATENT NO. : 8,951,832 B2
APPLICATION NO. : 14/216068
DATED : February 10, 2015
INVENTOR(S) : Jun Liu Page 1 of 1

It is certified that error appears in the above-identified patent and that said Letters Patent is hereby corrected as shown below:

In the Claims

In column 10, line 26, in Claim 5, delete "an" and insert -- and --, therefor.

Signed and Sealed this
Fifth Day of May, 2015

Michelle K. Lee
*Director of the United States Patent and Trademark Office*